United States Patent
Yamagiwa

(10) Patent No.: US 8,199,500 B2
(45) Date of Patent: Jun. 12, 2012

(54) HEAT RADIATION MECHANISM OF ELECTRONIC APPARATUS AND ELECTRONIC APPARATUS

(75) Inventor: Daisuke Yamagiwa, Daito (JP)

(73) Assignee: Funai Electric Co., Ltd., Daito-shi (JP)

( * ) Notice: Subject to any disclaimer, the term of this patent is extended or adjusted under 35 U.S.C. 154(b) by 280 days.

(21) Appl. No.: 12/687,291

(22) Filed: Jan. 14, 2010

(65) Prior Publication Data

US 2010/0188815 A1 Jul. 29, 2010

(30) Foreign Application Priority Data

Jan. 28, 2009 (JP) .................................. 2009-16173

(51) Int. Cl.
*H05K 7/20* (2006.01)
*F28D 15/00* (2006.01)

(52) U.S. Cl. ...................... 361/692; 361/695; 361/679.5; 361/679.51; 361/679.53; 165/104.34; 454/184

(58) Field of Classification Search ................ 361/687, 361/679.5, 679.51, 679.53, 692, 695; 454/184; 165/104.34
See application file for complete search history.

(56) References Cited

U.S. PATENT DOCUMENTS

| | | | | |
|---|---|---|---|---|
| 5,297,005 A | * | 3/1994 | Gourdine | 361/697 |
| 5,339,221 A | * | 8/1994 | Conroy-Wass et al. | 361/796 |
| 5,422,787 A | * | 6/1995 | Gourdine | 361/697 |
| 5,477,417 A | * | 12/1995 | Ohmori et al. | 361/695 |
| 5,559,673 A | * | 9/1996 | Gagnon et al. | 361/695 |
| 5,563,768 A | * | 10/1996 | Perdue | 361/695 |
| 6,094,346 A | * | 7/2000 | Schweers et al. | 361/695 |
| 6,459,579 B1 | * | 10/2002 | Farmer et al. | 361/695 |
| 6,702,661 B1 | * | 3/2004 | Clifton et al. | 454/184 |
| 6,721,180 B2 | * | 4/2004 | Le et al. | 361/695 |
| 6,924,981 B2 | * | 8/2005 | Chu et al. | 361/696 |
| 6,940,716 B1 | * | 9/2005 | Korinsky et al. | 361/695 |
| 6,987,673 B1 | * | 1/2006 | French et al. | 361/727 |
| 7,042,720 B1 | * | 5/2006 | Konshak et al. | 361/679.33 |
| 7,139,170 B2 | * | 11/2006 | Chikusa et al. | 361/695 |
| 7,154,748 B2 | * | 12/2006 | Yamada | 361/690 |
| 7,187,547 B1 | * | 3/2007 | French et al. | 361/679.33 |
| 7,215,552 B2 | * | 5/2007 | Shipley et al. | 361/721 |
| 7,262,962 B1 | * | 8/2007 | McLeod et al. | 361/679.48 |

(Continued)

FOREIGN PATENT DOCUMENTS

FR 2 585 918 A1 2/1987

(Continued)

OTHER PUBLICATIONS

The Extended European Search Report dated May 20, 2010 (Six (6) pages).

*Primary Examiner* — Anatoly Vortman
(74) *Attorney, Agent, or Firm* — Crowell & Moring LLP

(57) ABSTRACT

In a heat radiation mechanism of an electronic apparatus, an opening allowing flow of air between a first duct side and a second duct side is formed on a portion mounted with a heating device of a circuit board in an air flow route constituted by a first duct and a second duct, and heat generated from the heating device is radiated from a first vent hole or a second vent hole through the air flow route.

19 Claims, 11 Drawing Sheets

U.S. PATENT DOCUMENTS

| | | | |
|---|---|---|---|
| 7,447,021 B2 * | 11/2008 | Chen | 361/695 |
| 7,652,882 B2 * | 1/2010 | Korinsky et al. | 361/695 |
| 7,813,121 B2 * | 10/2010 | Bisson et al. | 361/679.51 |
| 2003/0053293 A1 * | 3/2003 | Beitelmal et al. | 361/687 |
| 2004/0109288 A1 * | 6/2004 | Beitelmal et al. | 361/687 |
| 2004/0264128 A1 * | 12/2004 | Crippen et al. | 361/687 |
| 2005/0168945 A1 * | 8/2005 | Coglitore | 361/695 |
| 2006/0061966 A1 * | 3/2006 | Korinsky et al. | 361/695 |
| 2006/0176665 A1 * | 8/2006 | Matsushima et al. | 361/687 |
| 2007/0002536 A1 * | 1/2007 | Hall et al. | 361/695 |
| 2007/0274039 A1 * | 11/2007 | Hamlin | 361/695 |
| 2008/0055846 A1 * | 3/2008 | Clidaras et al. | 361/687 |
| 2008/0094799 A1 * | 4/2008 | Zieman et al. | 361/695 |
| 2008/0113604 A1 * | 5/2008 | Tufford et al. | 454/187 |
| 2010/0157522 A1 * | 6/2010 | Refai-Ahmed | 361/679.54 |

FOREIGN PATENT DOCUMENTS

| | | |
|---|---|---|
| JP | 7-3015 U | 1/1995 |
| JP | 7-312491 A | 11/1995 |
| JP | 2003-174276 A | 6/2003 |
| JP | 2006-3928 A | 1/2006 |
| JP | 2007-123641 A | 5/2007 |

* cited by examiner

HEAT RADIATION MECHANISM OF ELECTRONIC APPARATUS AND ELECTRONIC APPARATUS

BACKGROUND OF THE INVENTION

1. Field of the Invention

The present invention relates to a heat radiation mechanism of an electronic apparatus and an electronic apparatus, and more particularly, it relates to a heat radiation mechanism of an electronic apparatus and an electronic apparatus each comprising vent holes for radiating heat generated from a heating device.

2. Description of the Background Art

In general, a heat radiation mechanism of an electronic apparatus comprising a vent hole for radiating heat generated from a heating device is disclosed in Japanese Patent Laying-Open No. 2003-174276, for example.

The aforementioned Japanese Patent Laying-Open No. 2003-174276 discloses a heat radiation mechanism of an electronic apparatus comprising a housing including an upper housing and a lower housing, a circuit board arranged in the housing, and a heating device mounted on the circuit board. A vent hole inlet for sucking air is formed on a bottom surface of a lower housing, and a vent hole outlet for radiating heat generated from the heating device is formed on an upper surface of the upper housing. A protrusion is formed on the vent hole outlet formed on the upper surface of the upper housing to protrude from the vent hole outlet to the heating device side (downward). The heating device is cooled by air sucked from the vent hole inlet and air on an upper portion of the heating device is heated. An air density of the heated air becomes small, the air becomes rising air to be discharged (radiated) from the vent hole outlet through the protrusion.

In the heat radiation mechanism of the electronic apparatus disclosed in the aforementioned Japanese Patent Laying-Open No. 2003-174276, however, the cold air sucked from the vent hole inlet is diffused in the housing and hence the heating device is disadvantageously difficult to be cooled. Thus, the heat generated from the heating device is disadvantageously difficult to be effectively radiated.

SUMMARY OF THE INVENTION

The present invention has been proposed in order to solve the aforementioned problems, and an object of the present invention is to provide a heat radiation mechanism of an electronic apparatus and an electronic apparatus each capable of effectively radiating heat generated from a heating device.

A heat radiation mechanism of an electronic apparatus according to a first aspect of the present invention comprises a housing set with a circuit board mounted with a heating device therein and including a first vent hole formed on a prescribed outer surface to be located above the heating device and a second vent hole formed on an outer surface different from the outer surface formed with the first vent hole to be located below the heating device, a first duct arranged to extend from the first vent hole toward the circuit board, and a second duct arranged to extend from the second vent hole toward the circuit board, wherein an air flow route allowing flow of air between the first vent hole and the second vent hole is formed by the first duct and the second duct, at least a portion mounted with the heating device of the circuit board is arranged in the air flow route, and an opening allowing flow of air between the first duct side and the second duct side is formed on the portion mounted with the heating device of the circuit board in the air flow route, and heat generated from the heating device is radiated from the first vent hole or the second vent hole through the air flow route.

In the heat radiation mechanism of the electronic apparatus according to the first aspect, as hereinabove described, the air flow route allowing flow of air between the first vent hole and the second vent hole is formed by the first duct and the second duct, at least the portion mounted with the heating device of the circuit board is arranged in the air flow route, and the opening allowing flow of air between the first duct side and the second duct side is formed on the portion mounted with the heating device of the circuit board in the air flow route, and heat generated from the heating device is radiated from the first vent hole or the second vent hole through the air flow route. Thus, the cold air sucked from one of either the first vent hole or the second vent hole passes through the air flow route and the opening to be guided to the portion mounted with the heating device of the circuit board, and hence the heating device is cooled by the cold air. Consequently, the density of the air warmed by the heat generated from the heating device is reduced, the air becomes the rising air, the warmed air can be discharged (radiated) to the outside from the other of either the first vent hole or the second vent hole, and hence the heat generated from the heating device can be effectively radiated.

In the aforementioned heat radiation mechanism of an electronic apparatus according to the first aspect, a portion of the first duct on the circuit board side and a portion of the second duct on the circuit board side are preferably connected substantially with no clearance in a state of holding the portion mounted with the heating device of the circuit board therebetween. According to this structure, sucked air is difficult to leak from a boundary between the first and second ducts into the housing, and hence diffusion of the sucked air into the housing can be suppressed. Thus, the heat generated from the heating device can be more effectively radiated.

In the aforementioned heat radiation mechanism of an electronic apparatus according to the first aspect, a portion of the first duct on the circuit board side and a portion of the second duct on the circuit board side are preferably arranged to be in close contact with each other in a state of holding the portion mounted with the heating device of the circuit board therebetween. According to this structure, air sucked from either the first duct or the second duct is difficult to leak from the boundary between the first and second ducts into the housing, and hence diffusion of the sucked air into the housing can be suppressed. Thus, the heat generated from the heating device can be more effectively radiated.

In the aforementioned heat radiation mechanism of an electronic apparatus according to the first aspect, in a case where an X-axis, a Y-axis and a Z-axis orthogonal to each other are considered assuming that the heating device is an origin, the first vent hole is preferably provided on plus direction sides of at least the Y- and Z-axes, and the second vent hole is preferably provided on minus direction sides of at least the Y- and Z-axes. According to this structure, the first vent hole and the second vent hole are formed to be diagonal (on opposite sides) with each other in the two Y- and Z-axial directions by employing the heating device as the origin. Thus, one of either the first vent hole or the second vent hole can be located above the heating device, while the other of either the first vent hole or the second vent hole can be located below the heating device in a case where the housing is so set (mounted) that any of the surfaces of the housing in the plus direction of the Y-axis, the minus direction of the Y-axis, the plus direction of the Z-axis and the minus direction of the Z-axis is located on a lower side, for example. Consequently, the air sucked from the vent hole located below the heating device can be discharged from the vent hole located above the heating device.

In this case, the first vent hole is preferably provided on the plus direction sides of the X-, Y- and Z-axes, and the second vent hole is preferably provided on the minus direction sides of the X-, Y- and X-axes. According to this structure, the first vent hole and the second vent hole are formed to be diagonal (on opposite sides) with each other in the three X-, Y- and Z-axial directions by employing the heating device as the origin. Thus, one of either the first vent hole or the second vent hole can be always located above the heating device, while the other of either the first vent hole or the second vent hole can be always located below the heating device also in a case where the outer surface on which the housing is set (mounted) is changed, for example. Consequently, the first vent hole and the second vent hole are not located at the same height, and hence air sucked from the vent hole located below the heating device can be always discharged from the vent hole located above the heating device.

In the aforementioned heat radiation mechanism of an electronic apparatus according to the first aspect, a portion of the first duct on the first vent hole side and the first vent hole are preferably connected substantially with no clearance, and a portion of the second duct on the second vent hole side and the second vent hole are connected substantially with no clearance. According to this structure, air can be inhibited from leaking from between the portion of the first duct on the first vent hole side and the first vent hole and from between the portion of the second duct of the second vent hole side and the second vent hole into the housing 1. Thus, the air warmed by the heat generated from the heating device can be reliably discharged (radiated) to the outside of the housing.

In the aforementioned heat radiation mechanism of an electronic apparatus according to the first aspect, at least one of the first duct and the second duct preferably includes a first air flow portion arranged on the heating device side, and a second air flow portion arranged on at least one of the first vent hole side and the second vent hole side, and a section area of the air flow route of the second air flow portion is preferably smaller than a section area of the air flow route of the first air flow portion. According to this structure, the air density of the air flow route of the second air flow portion is larger than the air density of the air flow route of the first air flow portion, and hence a flow rate of the air of the second air flow portion on the vent hole side can be rendered larger than a flow rate of the air on the first air flow portion on the heating device side. Thus, the air warmed by the heat generated from the heating device can be promptly discharged (radiated) to the outside.

In the aforementioned heat radiation mechanism of an electronic apparatus according to the first aspect, the opening allowing flow of air between the first duct side and the second duct side is preferably substantially rectangular in plan view, the opening and the heating device are preferably arranged to be adjacent to each other, and a length of the opening in a longitudinal direction is preferably larger than a length of the heating device corresponding to the longitudinal direction of the opening. According to this structure, an overall surface of the heating device corresponding to the longitudinal direction of the opening can be easily exposed to the air introduced from the opening dissimilarly to a case where the length of the opening the longitudinal direction is smaller than the length of the heating device corresponding to the longitudinal direction of the opening, for example, and hence the heating device can be easily cooled.

In the aforementioned heat radiation mechanism of an electronic apparatus according to the first aspect, the first duct and the second ducts preferably include first air flow portions arranged on the heating device sides and formed to extend in a direction substantially perpendicular to the circuit board, and second air flow portions arranged on the first vent hole side and the second vent hole side respectively and formed to be inclined by prescribed angles with respect to the first air flow portions, respectively. According to this structure, the second air flow portions are provided to be inclined by the prescribed angles with respect to the first air flow portions extending substantially perpendicular to the circuit board in a case where the circuit board is arranged parallel to a set surface of the housing, and hence the first and second vent holes connected to the second air flow portions can be formed on the outer surfaces other than the outer surface on the set surface side of the housing. Thus, the air from the first and second vent holes can be smoothly sucked and discharged.

In the aforementioned heat radiation mechanism of an electronic apparatus according to the first aspect, a leg portion for spacing the outer surface of the housing on a set surface side from the set surface of the housing is preferably provided on the outer surface of the housing on the set surface side among the outer surfaces, formed with the first vent hole and the second vent hole, of the housing. According to this structure, the first or second vent hole of the housing can be inhibited from being blocked by the set surface of the housing, and hence suction of the air from the first or second vent hole and discharge of the air from the first or second vent can be reliably performed.

In the aforementioned heat radiation mechanism of an electronic apparatus according to the first aspect, a prescribed clearance is preferably formed between a side end of the circuit board arranged on a boundary between the first duct and the second duct in the air flow route and an inner surface of the air flow route opposed to the side end of the circuit board, so that the opening allowing flow of air between the first duct side and the second duct side is formed. According to this structure, the cold air sucked from one of either the first duct side or the second duct side can be guided to the other of the first duct side or the second duct side through the prescribed clearance consisting of the opening.

In this case, the circuit board is preferably arranged on a partial region of the boundary between the first duct and the second duct to be held between the first duct and the second duct, and portions, holding the circuit board therebetween, of the first duct and the second duct are preferably in close contact with surfaces of the circuit board, and portions, other than the portions holding the circuit board therebetween, of the first duct and the second duct are preferably arranged to be in close contact with each other. According to this structure, air can be inhibited from leaking from between the first duct and the second duct and from between the first and second ducts and the circuit board, and hence diffusion of the air into the housing can be suppressed.

In the aforementioned heat radiation mechanism of an electronic apparatus according to the first aspect, the air flow hole is preferably provided in the vicinity of a region mounted with the heating device of the circuit board arranged in the air flow route, so that the opening allowing flow of air between the first duct side and the second duct side is formed. According to this structure, cold air sucked from one of either the first duct side or the second duct side is guided to the other of the first duct side or the second duct side through the opening consisting of the air flow hole provided in the vicinity of the region mounted with the heating device of the circuit board.

In this case, the circuit board provided with the air flow hole is preferably arranged to be held between the first duct and the second duct in a state of blocking the first duct and the second duct on the boundary between the first duct and the second duct, and the first duct and the second duct are preferably arranged to be in close contact with the surfaces of the circuit board. According to this structure, air can flow between the first duct and the second duct through the opening consisting of the air flow hole while suppressing leak of the air from between the first duct and the circuit board and from between the second duct and the circuit board.

In the aforementioned heat radiation mechanism of an electronic apparatus according to the first aspect, each of the first vent hole and the second vent hole arranged with the first duct and the second duct respectively is so chamfered that an opening area is increased from an inner surface side of the housing toward an outer surface side. According to this structure, the air warmed by the heat of the heating device can be smoothly discharged from the inner surface side toward the outer surface side along the chamfered portions of the first or second vent hole.

An electronic apparatus according to a second aspect according to the present invention comprises a circuit board mounted with a heating device, a housing set with the circuit board therein and including a first vent hole formed on a prescribed outer surface to be located above the heating device and a second vent hole formed on an outer surface different from the outer surface formed with the first vent hole to be located below the heating device, a first duct arranged to extend from the first vent hole toward the circuit board and a second duct arranged to extend from the second vent hole toward the circuit board, wherein an air flow route allowing flow of air between the first vent hole and the second vent hole is formed by the first duct and the second duct, at least a portion mounted with the heating device of the circuit board is arranged in the air flow route, and an opening allowing flow of air between the first duct side and the second duct side is formed on the portion mounted with the heating device of the circuit board in the air flow route, and heat generated from the heating device is radiated from the first vent hole or the second vent hole through the air flow route.

In the electronic apparatus according to the second aspect, as hereinabove described, the air flow route allowing flow of air between the first vent hole and the second vent hole is formed by the first duct and the second duct, at least the portion mounted with the heating device of the circuit board is arranged in the air flow route, and the opening allowing flow of air between the first duct side and the second duct side is formed on the portion mounted with the heating device of the circuit board in the air flow route, and heat generated from the heating device is radiated from the first vent hole or the second vent hole through the air flow route. Thus, the cold air sucked from either the first vent hole or the second vent hole passes through the air flow route and the opening to be guided to the portion mounted with the heating device of the circuit board, and hence the heating device is cooled by the cold air. Consequently, the density of the air warmed by the heat generated from the heating device is reduced, the air becomes the rising air, the warmed air can be discharged (radiated) to the outside from either the first vent hole or the second vent hole, and hence the electronic apparatus capable of effectively radiating the heat generated from the heating device can be obtained.

In the aforementioned electronic apparatus according to the second aspect, a portion of the first duct on the circuit board side and a portion of the second duct on the circuit board side are preferably connected substantially with no clearance in a state of holding the portion mounted with the heating device of the circuit board therebetween. According to this structure, sucked air is difficult to leak from a boundary between the first and second ducts into the housing, and hence diffusion of the sucked air into the housing can be suppressed. Thus, the heat generated from the heating device can be more effectively radiated.

In the aforementioned electronic apparatus according to the second aspect, a portion of the first duct on the circuit board side and a portion of the second duct on the circuit board side are preferably arranged to be in close contact with each other in a state of holding the portion mounted with the heating device of the circuit board therebetween. According to this structure, air sucked from one of either the first duct or the second duct is difficult to leak from a boundary between the first and second ducts into the housing, and hence diffusion of the sucked air into the housing can be suppressed. Thus, the heat generated from the heating device can be more effectively radiated.

In the aforementioned electronic apparatus according to the second aspect, in a case where an X-axis, a Y-axis and a Z-axis orthogonal to each other are considered assuming that the heating device is an origin, the first vent hole is preferably provided on plus direction sides of at least the Y- and Z-axes, and the second vent hole is provided on minus direction sides of at least the Y- and Z-axes. According to this structure, the first vent hole and the second vent hole are formed to be diagonal (on opposite sides) with each other in the Y- and Z-axial directions by employing the heating device as the origin. Thus, one of either the first vent hole or the second vent hole can be located above the heating device, while the other of either the first vent hole or the second vent hole can be located below the heating device in a case where the housing is so set (mounted) that any of the surfaces of the housing in the plus direction of the Y-axis, the minus direction of the Y-axis, the plus direction of the Z-axis and the minus direction of the Z-axis can be located on a lower side. Consequently, the air sucked from the vent hole located below the heating device can be discharged from the vent hole located above the heating device.

In this case, the first vent hole is preferably provided on the plus direction sides of the X-, Y- and Z-axes, and the second vent hole is preferably provided on the minus direction sides of the X-, Y- and Z-axes. According to this structure, the first vent hole and the second vent hole are formed to be diagonal (on opposite sides) with each other in the three X-, Y- and Z-axial directions by employing the heating device as the origin, and hence one of either the first vent hole or the second vent hole can be always located above the heating device, while the other of either the first vent hole or the second vent hole can be always located below the heating device also in a case where the outer surface on which the housing is set (mounted) is changed, for example. Consequently, the first vent hole and the second vent hole are not located at the same height, and hence air sucked from the vent hole located below the heating device can be always discharged from the vent hole located above the heating device.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
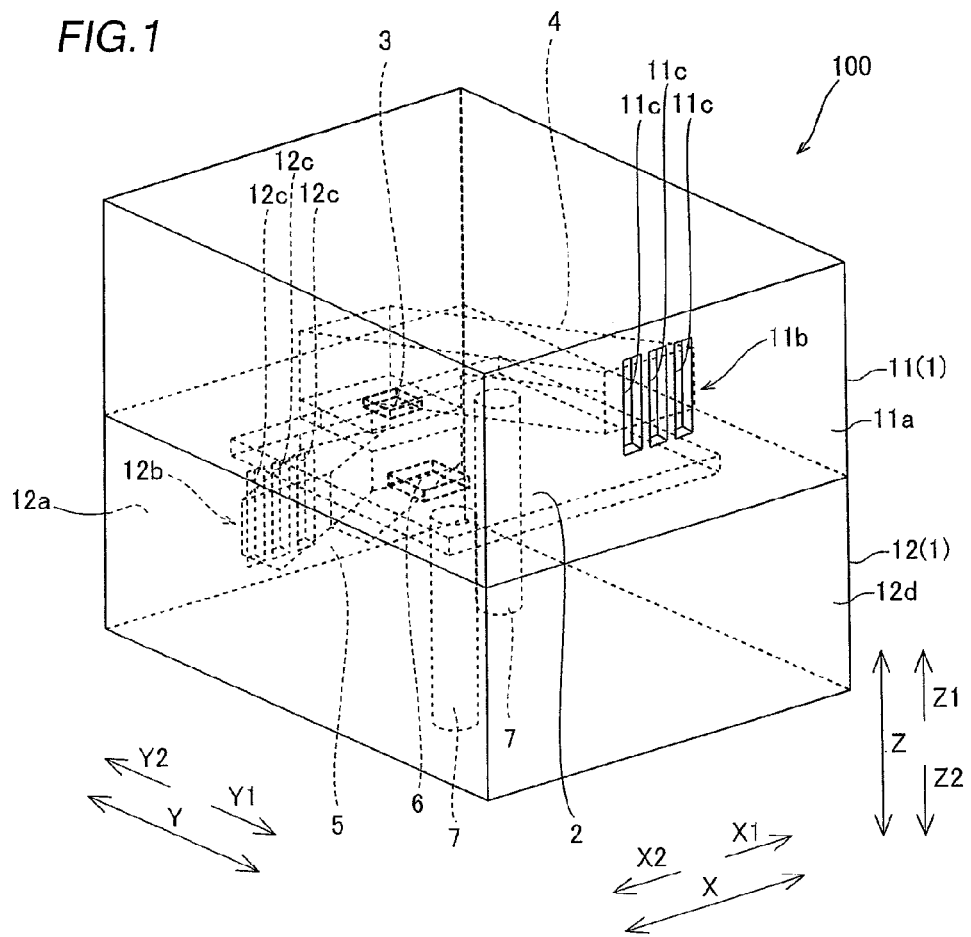
FIG. 1 is an entire perspective view of a heat radiation mechanism of an electronic apparatus according to a first embodiment of the present invention.
Figure 2:
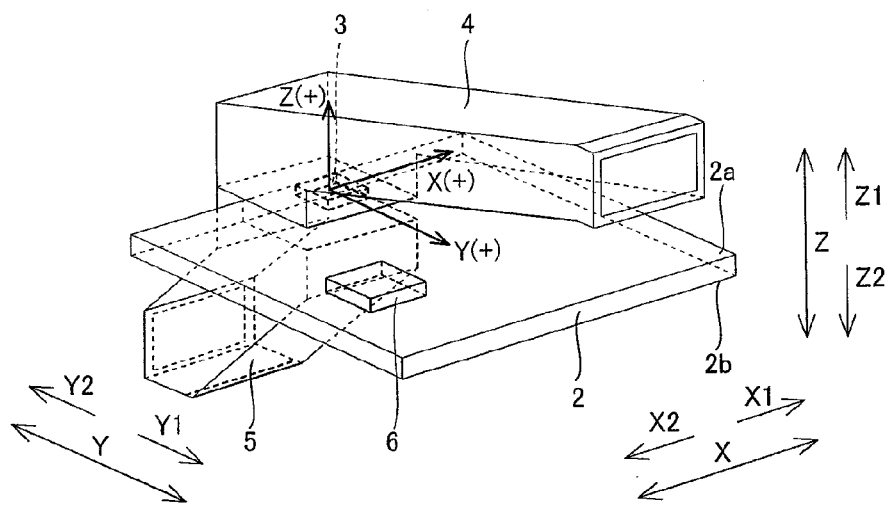
FIGS. 2 and 3 are perspective views of the heat radiation mechanism of the electronic apparatus according to the first embodiment of the present invention.

Embodiments of the present invention will be hereinafter described with reference to the drawings.

(First Embodiment)

A structure of a heat radiation mechanism of an electronic apparatus 100 according to the first embodiment of the present invention will be described with reference to FIGS. 1 to 9.

As shown in FIGS. 1 to 4, the heat radiation mechanism of the electronic apparatus 100 according to the first embodiment of the present invention comprises a housing 1, a circuit board 2 mounted in the housing 1, a heating device 3 mounted on the circuit board 2, a first duct 4 arranged above the heating device 3, a second duct 5 arranged below the heating device 3, a device 6 other than the heating device 3 arranged on the circuit board 2, and board support portions 7 supporting the circuit board 2.

Figure 6:
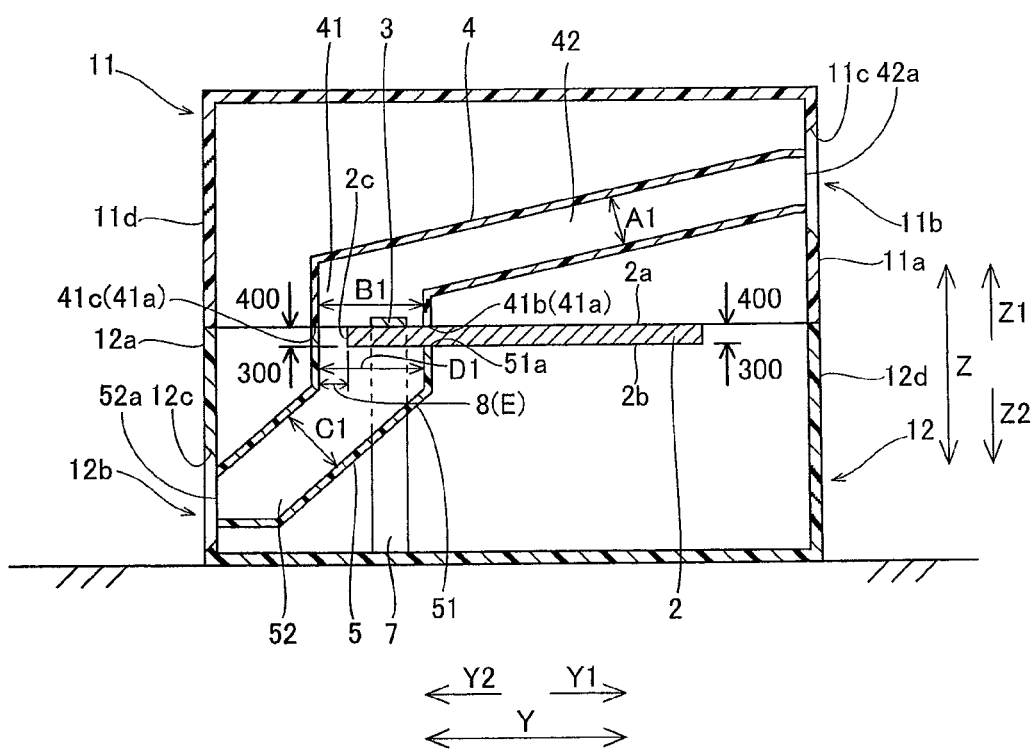
FIG. 6 is a sectional view taken along the line 200-200 in FIG. 5.
Figure 7:
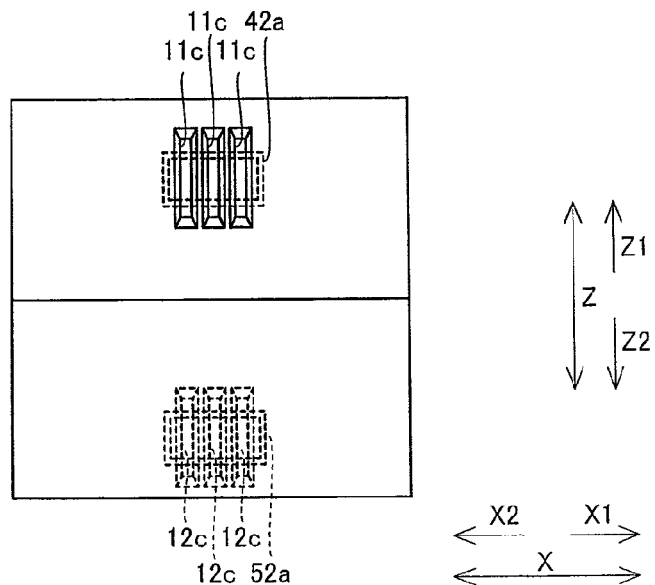
FIG. 7 is a side elevational view showing a vent hole of the heat radiation mechanism of the electronic apparatus according to the first embodiment of the present invention.

The housing 1 of the electronic apparatus 100 includes an upper housing 11 and a lower housing 12. A first vent hole 11b is formed on a side surface (outer surface) 11a of the upper housing 11. This first vent hole 11b includes rectangular three slits 11c extending in a direction Z, as shown in FIGS. 1 and 7. The first vent hole 11b is formed above the heating device 3 (on a side along arrow Z1 (Z(+)), as shown in FIG. 6. The three slits 11c are so chamfered that opening areas are increased from an inner surface side (side along arrow Y2) of the housing 1 toward an outer surface side (side along arrow Y1).

As shown in FIG. 1, a second vent hole 12b is formed on a side surface (outer surface) 12a of the lower housing 12. This second vent hole 12b includes rectangular three slits 12c extending in the direction Z, as shown in FIG. 7. The second vent hole 12b is formed below the heating device 3 (on a side along arrow Z2 (Z(−)), as shown in FIG. 6. The three slits 12c are so chamfered that opening areas are increased from an inner surface side (side along arrow Y1) of the housing 1 toward an outer surface side (side along arrow Y2).

Figure 5:
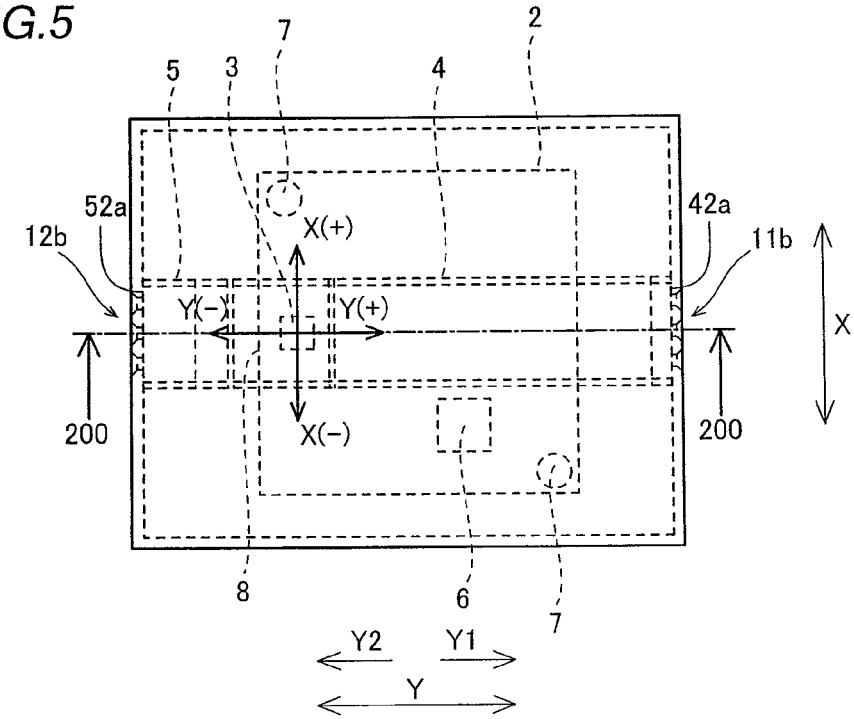
FIG. 5 is a plan view of the heat radiation mechanism of the electronic apparatus according to the first embodiment of the present invention.

As shown in FIGS. 1 to 4, in a case where an X-axis, a Y-axis and a Z-axis orthogonal to each other are considered assuming that a center of the heating device 3 is an origin, the first vent hole 11b is provided on plus direction sides (sides along arrows Y1 (Y(+)) and Z1 (Z(+)) of the two Y- and Z-axes (directions Y and Z) of the housing 1. The second vent hole 12b is provided on minus direction sides (sides along arrows Y2 (Y(−)) and Z2 (Z(−)) of the Y- and Z-axes (directions Y and Z) of the housing 1. As shown in FIG. 5, positions of the X-axis (direction X) formed with the first and second vent holes 11b and 12b of the housing 1 are the same.

As shown in FIG. 6, columnar board support portions 7 are formed on the lower housing 12 to extend from a lower surface of the lower housing 12 upward (side along arrow Z1). As shown in FIG. 6, the circuit board 2 is set on an upper portion of the board support portions 7 by a screw member (not shown) and the like.

According to the first embodiment, the first duct 4 is arranged to extend from the first vent hole 11b of the upper housing 11 toward the circuit board 2. As shown in FIG. 5, the first duct 4 is formed to extend in the direction Y in plan view. In a case where the Z-axis and the Y-axis are considered assuming that the center of the heating device 3 is the origin, the first duct 4 is provided to extend to the plus direction sides (sides along arrows Z1 (Z(+)) and Y1 (Y(+)) of the Z- and Y-axes (directions Z and Y). An air flow route allowing flow of air is formed on an inner surface of this first duct 4. A section of this air flow route is rectangular (horizontally-long rectangular).

Figure 8:
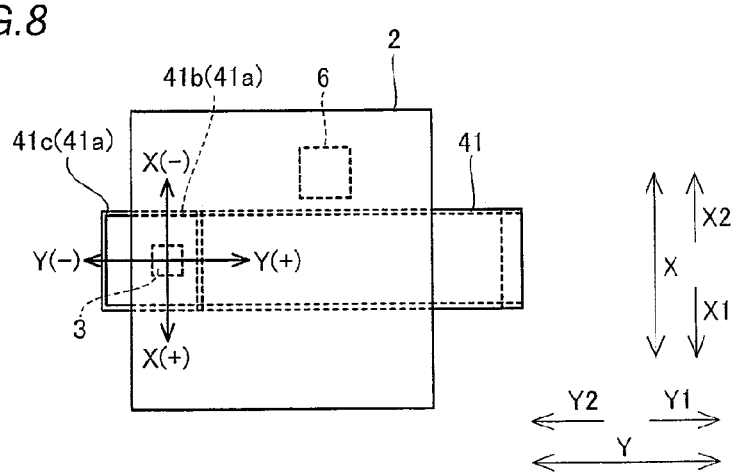
FIG. 8 is a sectional view taken along the line 300-300 in FIG. 6.

As shown in FIG. 6, the first duct 4 includes a first air flow portion 41 and a second air flow portion 42. The lower surface 41a of the first air flow portion 41 is arranged to enclose the heating device 3 in plan view, as shown in FIG. 8. A portion 41b, holding the circuit board 2, of the lower surface 41a of the first air flow portion 41 of the first duct 4 is arranged to be in close contact with an upper surface 2a of the circuit board 2, as shown in FIG. 6. A portion 41c, connected to the second duct 5, of the lower surface 41a of the first air flow portion 41 of the first duct 4 is arranged to be in close contact with an upper surface 51a of the second duct 5. The first air flow portion 41 is formed to extend upward (on the side along arrow Z1) substantially perpendicular to the upper surface 2a of the circuit board 2.

Figure 3:
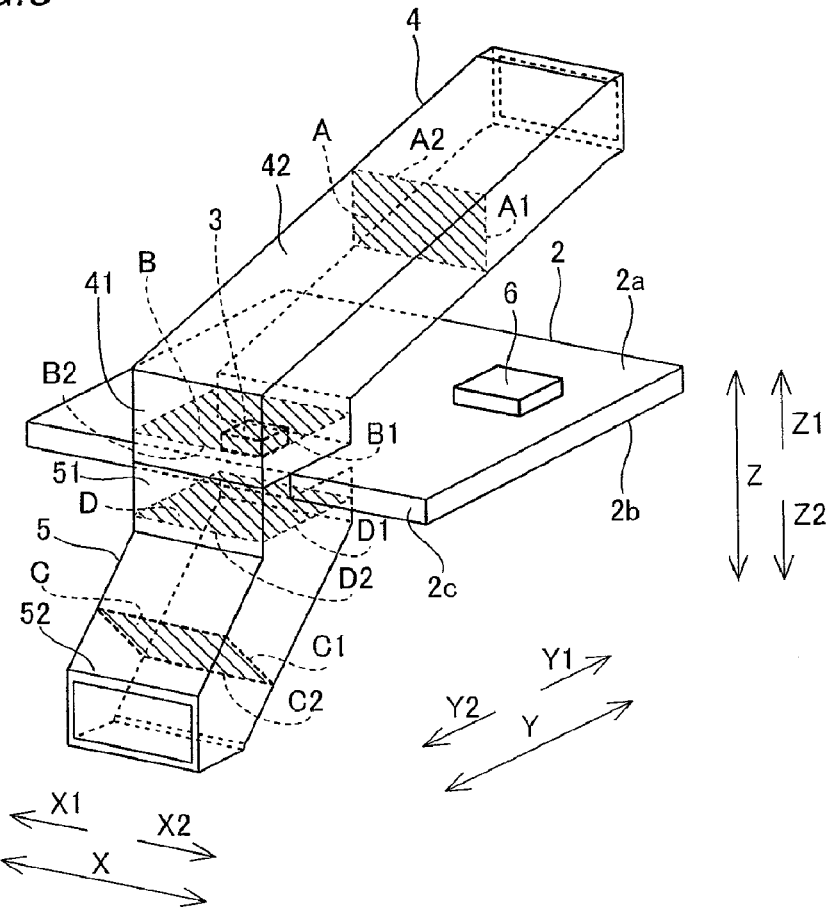
Figure 4:
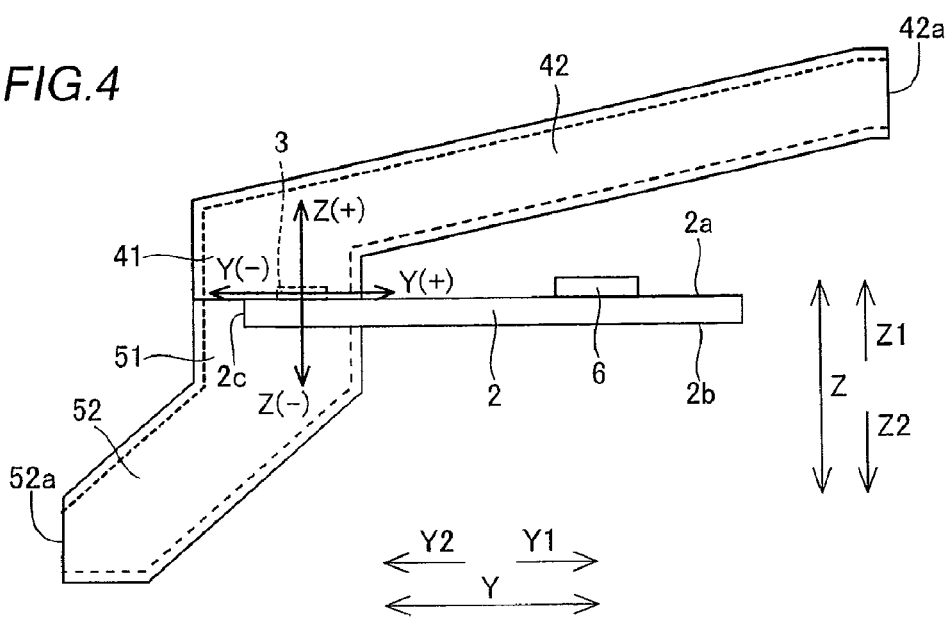
FIG. 4 is a side elevational view of the heat radiation mechanism of the electronic apparatus according to the first embodiment of the present invention.

The second air flow portion 42 of the first duct 4 is formed in a state inclined with respect to the first air flow portion 41 by a prescribed angle. A portion 42a on the first vent hole 11b side of the second air flow portion 42 is connected to the first vent hole 11b substantially with no clearance and fixed by the screw member (not shown) and the like. According to the first embodiment, a section area A of an air flow route of the second air flow portion 42 is smaller than a section area B of an air flow route of the first air flow portion 41, as shown in FIG. 3. In other words, a length A1 of the second air flow portion 42 is smaller than a length B1 of the first air flow portion 41 and a length A2 and a length B2 are substantially equal, so that the section area A is smaller than the section area B.

According to the first embodiment, the second duct 5 is arranged to extend from the second vent hole 12b of the lower housing 12 toward the circuit board 2. The second duct 5 is formed to extend in the direction Y in plan view, as shown in FIG. 5. In a case where the Z-axis and the Y-axis are considered assuming that the center of the heating device 3 is the origin, the second duct 5 is provided to extend to the minus direction side (sides along arrow Z2 (Z(−)) and Y2 (Y(−)) of the Z- and Y-axes (directions Z and Y). An air flow route allowing flow of air is formed on an inner surface of this second duct 5. A section of the air flow route is rectangular (horizontally-long rectangular).

Figure 9:
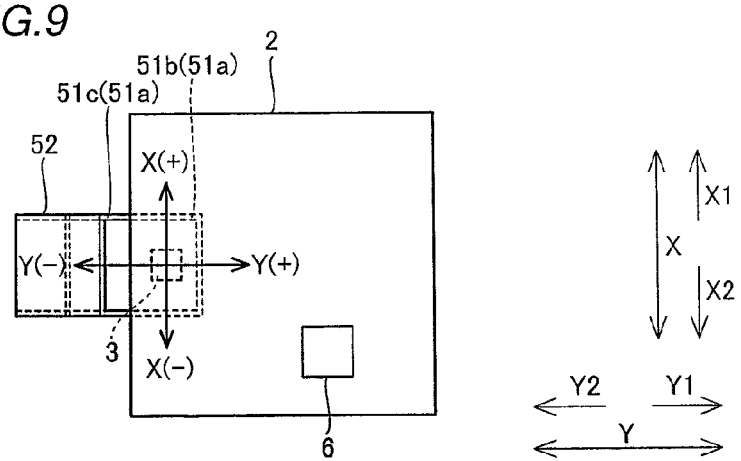
FIG. 9 is a sectional view taken along the line 400-400 in FIG. 6.

The first duct 5 includes a first air flow portion 51 and a second air flow portion 52, as shown in FIG. 6. The upper surface 51a of the first air flow portion 51 is arranged to enclose the heating device 3 in plan view, as shown in FIG. 9. A portion 51b, holding the circuit board 2, of the upper surface 51a of the first air flow portion 51 of the second duct 5 is arranged to be in close contact with a lower surface 2b of the circuit board 2, as shown in FIG. 6. A portion 51c, connected to the first duct 4, of the upper surface 51a of the first air flow portion 51 of the second duct 5 is arranged to be in close contact with the lower surface 41a of the first duct 4. The first air flow portion 51 is formed to extend downward (on the side along arrow Z2) substantially perpendicular to the upper surface 2a of the circuit board 2. The first air flow portion 51 has a substantially L-shaped section, and is arranged to cover a side end 2c of the circuit board 2 on the side along arrow Y2.

The second air flow portion 52 of the second duct 5 is formed in a state inclined by a prescribed angle with respect to the first air flow portion 51. A portion 52a on the second vent hole 12b of the second air flow portion 52 is connected to the second vent hole 12b substantially with no clearance and fixed by the screw member (not shown) and the like. According to the first embodiment, a section area C of an air flow route of the second air flow portion 52 is smaller than a section area D of an air flow route of the first air flow portion 51, as shown in FIG. 3. In other words, a length C1 of the second air flow portion 52 is smaller than a length D1 of the first air flow portion 51 and a length C2 and a length D2 are substantially equal, so that the section area C is smaller than the section area D.

According to the first embodiment, the lower surface 41a of the first air flow portion 41 of the first duct 4 and the upper surface 51a of the first air flow portion 51 of the second duct 5 are connected to each other substantially with no clearance in a state of holding the portion mounted with the heating device 3 of the circuit board 2 therebetween, as shown in FIG. 6. A prescribed clearance E is formed between the side end 2c of the circuit board 2 arranged in the air flow route and the inner surface of the air flow route opposed to the side end 2c of the circuit board 2, so that an opening 8 allowing flow of air between the first duct 4 side and the second duct 5 side is formed. Thus, an air flow route allowing flow of air between the first vent hole 11b and the second vent hole 12b is formed. As shown in FIG. 5, the opening 8 is formed in a substantially rectangular shape in plan view. A length of the opening 8 in the direction X (longitudinal direction) is larger than a length (length corresponding to the longitudinal direction of the opening 8) of the heating device 3 in the direction X.

A heat radiation route of the heat radiation mechanism of the electronic apparatus 100 according to the first embodiment of the present invention will be now described with reference to FIG. 6.

The heat radiation mechanism of the electronic apparatus 100 according to the first embodiment of the present invention sucks cold air (outside air) from the second vent hole 12b formed on the side surface 12a of the lower housing 12, as shown in FIG. 6. The sucked air passes through the second and first air flow portions 52 and 51 of the second duct 5 and is guided to the first air flow portion 41 of the first duct 4 through the opening 8. Thus, the heating device 3 is cooled. Then, air warmed by heat of the heating device 3 has a reduced air density and becomes rising air. Thereafter, the air passes through the second air flow portion 42 of the first duct 4 and is discharged (radiated) from the first vent hole 11b formed on the side surface 11a of the upper housing 11.

According to the first embodiment, as hereinabove described, the first and second ducts 4 and 5 form the air flow route allowing flow of air between the first and second vent holes 11b and 12b, and the portion mounted with the heating device 3 of the circuit board 2 is arranged in the air flow route, the opening 8 allowing flow of air between the first duct 4 side and the second duct 5 side is formed on the portion mounted with the heating device 3 of the circuit board 2 in the air flow route, and the heat generated from the heating device 3 is radiated from the first or second vent hole 11b or 12b through the air flow route. Thus, the cold air sucked from the second vent hole 12b passes through the air flow route and the opening 8 to be guided to the portion mounted with the heating device 3 of the circuit board 2, and hence the heating device 3 is cooled by the cold air. Consequently, the density of the air warmed by the heat generated from the heating device 3 is reduced, the air becomes the rising air, the warmed air can be discharged (radiated) to the outside from the first vent hole 11b, and hence the heat generated from the heating device 3 can be effectively radiated.

According to the first embodiment, as hereinabove described, the portion of the first duct 4 on the circuit board 2 side and the portion of the second duct 5 on the circuit board 2 side are connected substantially with no clearance in the state of holding the portion mounted with the heating device 3 of the circuit board 2 therebetween, whereby sucked air is difficult to leak from a boundary between the first and second ducts 4 and 5 into the housing 1, and hence diffusion of the sucked air into the housing 1 can be suppressed. Thus, the heat generated from the heating device 3 can be more effectively radiated.

According to the first embodiment, as hereinabove described, the portion (surface) of the first duct 4 on the circuit board 2 side and the portion (surface) of the second duct 5 on the circuit board 2 side are arranged to be in close contact with each other in the state of holding the portion mounted with the heating device 3 of the circuit board 2 therebetween, whereby air sucked from either the first duct 4 or the second duct 5 is difficult to leak from the boundary between the first and second ducts 4 and 5 into the housing 1, and hence diffusion of the sucked air into the housing 1 can be suppressed. Thus, the heat generated from the heating device 3 can be more effectively radiated.

According to the first embodiment, as hereinabove described, the first vent hole 11b is provided on the plus direction sides of the Y- and Z-axes and the second vent hole 12b is provided on the minus direction sides of the Y- and Z-axes, whereby the first vent hole 11b and the second vent hole 12b are formed to be diagonal (on opposite sides) with each other in the two Y- and Z-axial directions by employing the heating device 3 as the origin. Consequently, one of either the first vent hole 11b or the second vent hole 12b can be located above the heating device 3, while the other of either the first vent hole 11b or the second vent hole 12b can be located below the heating device 3 in a case where the housing is so set (mounted) that any of the surfaces of the housing 1 in the plus direction of the Y-axis, the minus direction of the Y-axis, the plus direction of the Z-axis and the minus direction of the Z-axis is located on a lower side. Consequently, the air sucked from the vent hole located below the heating device 3 can be discharged from the vent hole located above the heating device 3.

According to the first embodiment, as hereinabove described, the portion of the first duct 4 on the first vent hole 11*b* side and the first vent hole 11*b* are connected substantially with no clearance, and the portion of the second duct 5 on the second vent hole 12*b* side and the second vent hole 12*b* are connected substantially with no clearance, whereby the air can be inhibited from leaking from between the portion of the first duct 4 on the first vent hole 11*b* side and the first vent hole 11*b* and from between the portion of the second duct 5 of the second vent hole 12*b* side and the second vent hole 12*b* into the housing 1, and hence the air warmed by the heat generated from the heating device 3 can be reliably discharged (radiated) to the outside of the housing 1.

According to the first embodiment, as hereinabove described, the section area A (C) of the air flow route of the second air flow portion 42 (52) is smaller than the section area B (D) of the air flow route of the first air flow portion 41 (51), whereby the air density of the air flow route of the second air flow portion 42 (52) is larger than the air density of the air flow route of the first air flow portion 41 (51), and hence a flow rate of the air on the second air flow portion 42 (52) side can be rendered larger than a flow rate of the air on the on the first air flow portion 41 (51). Thus, the air warmed by the heat generated from the heating device 3 can be promptly discharged (radiated) to the outside.

According to the first embodiment, as hereinabove described, the length of the opening 8 in the direction X (longitudinal direction) is larger than the length of the heating device 3 in the direction X (length corresponding to the longitudinal direction of the opening 8), whereby an overall surface of the heating device 3 in the direction X can be easily exposed to the air introduced from the opening 8 dissimilarly to a case where the length of the opening 8 in the direction X (longitudinal direction) is smaller than the length of the heating device 3 in the direction X, for example, and hence the heating device 3 can be easily cooled.

According to the first embodiment, as hereinabove described, the first air flow portion 41 (51) formed to extend substantially perpendicular to the circuit board 2 and the second air flow portion 42 (52) formed to be arranged on the first vent hole 11*b* side and the second vent hole 12*b* respectively and inclined by the prescribed angle with respect to the first air flow portion 41 (51) are included, whereby the second air flow portion 42 (52) is provided to be inclined by the prescribed angle with respect to the first air flow portion 41 (51) extending substantially perpendicular to the circuit board 2 in a case where the circuit board 2 is arranged parallel to a set surface of the housing 1, and hence the first and second vent holes 11*b* and 12*b* connected to the second air flow portion 42 (52) can be formed on the outer surface other than the outer surface on the set surface side of the housing 1. Thus, the air from the first and second vent holes 11*b* and 12*b* can be smoothly sucked and discharged.

According to the first embodiment, as hereinabove described, the opening 8 allowing flow of air between the first duct 4 side and the second duct 5 side is constituted by forming the prescribed clearance E between the side end 2*c* of the circuit board 2 arranged on the boundary between the first ducts 4 and the second duct 5 in the air flow route and the inner surface of the air flow route opposed to the side end 2*c* of the circuit board 2, whereby the cold air sucked from the second duct 5 side can be guided to the first duct 4 side through the prescribed clearance constituting the opening 8.

According to the first embodiment, as hereinabove described, the portions, holding the circuit board 2 therebetween, of the first and second ducts 4 and 5 are arranged to be in close contact with the upper surface 2*a* of the circuit board 2, and the portions, other than the portions holding the circuit board 2 therebetween, of the first and second ducts 4 and 5 are arranged to be in closer contact with each other, whereby air can be inhibited from leaking from between the first duct 4 and the second duct 5 and from between the first and second ducts 4 and 5 and the circuit board 2, and hence diffusion of the air into the housing 1 can be suppressed.

According to the first embodiment, as hereinabove described, each of the first and second vent holes 11*b* and 12*b* arranged on the first and second ducts 4 and 5 respectively are so chamfered that the opening area from the inner side surface of the housing 1 toward the outer surface side is increased, whereby the air warmed by the heat of the heating device 3 can be smoothly discharged from the inner surface side toward the outer surface side along the chamfered portions of the first or second vent hole 11*b* or 12*b*.

(Second Embodiment)

Referring to FIGS. 10 to 14, in a structure of a heat radiation mechanism of an electronic apparatus 100*a* according to a second embodiment of the present invention, in a case where an X-axis, a Y-axis and a Z-axis orthogonal to each other are considered assuming that a center of a heating device 3 is an origin, a first vent hole 110*b* is provided on plus direction sides of the X-, Y- and Z-axes, while a second vent hole 120*b* is provided on minus direction sides of the X-, Y- and Z-axes, dissimilarly to the aforementioned first embodiment.

Figure 13:
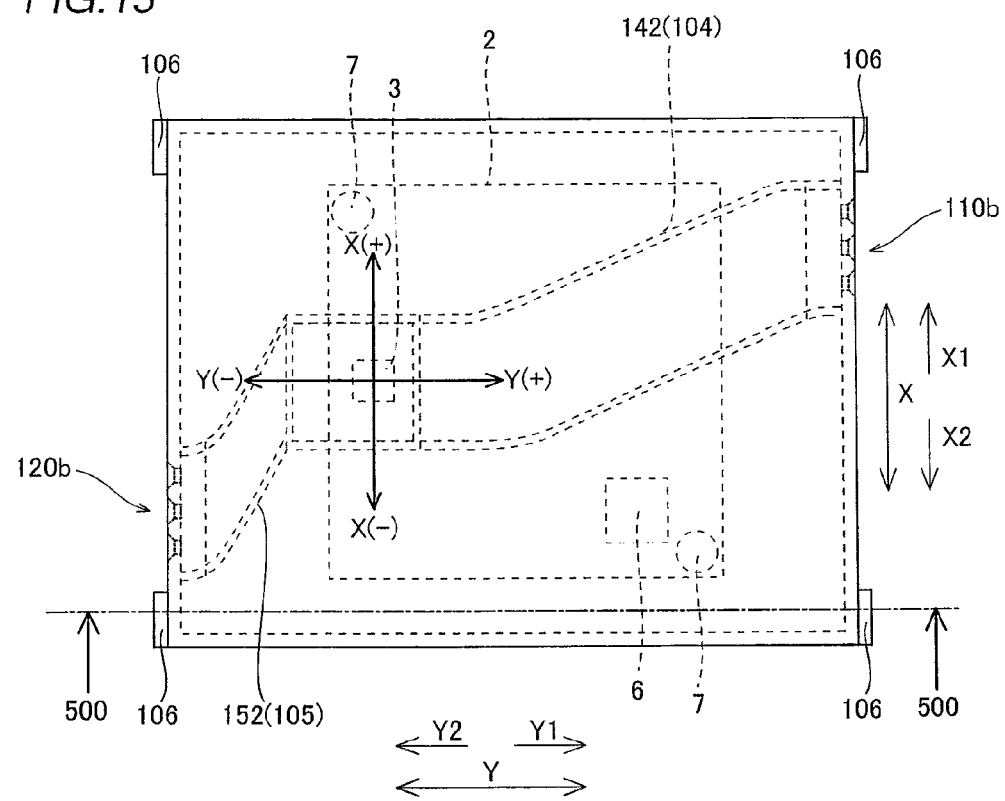
FIG. 13 is a plan view of the heat radiation mechanism of the electronic apparatus according to the second embodiment of the present invention.
Figure 14:
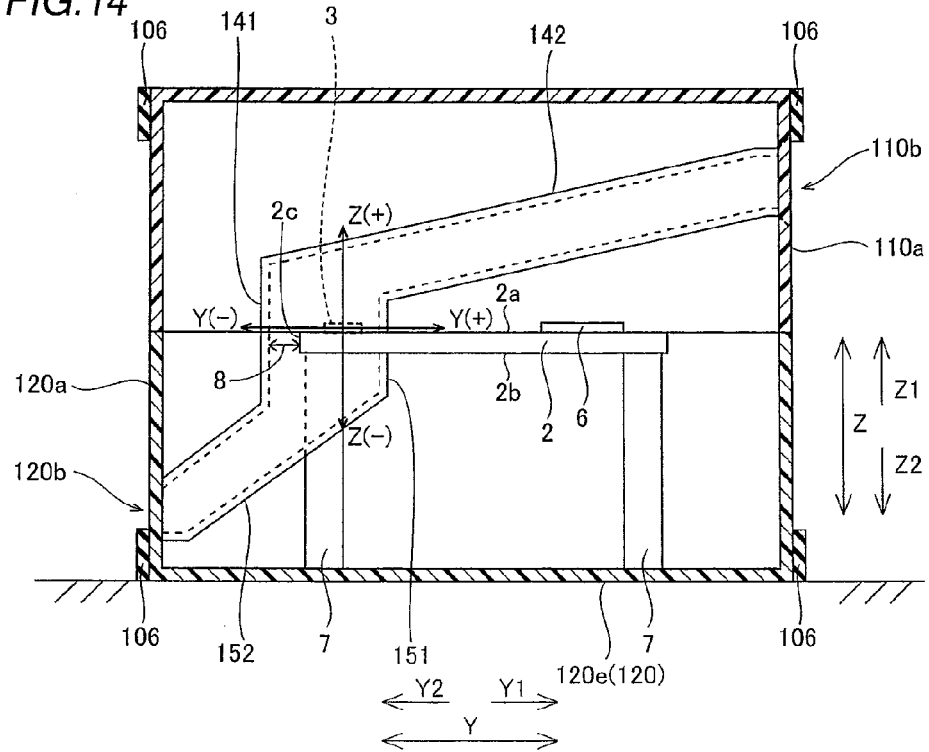
FIGS. 14 to 17 are sectional views taken along the line 500-500 in FIG. 13.

In the heat radiation mechanism of the electronic apparatus 100*a* according to the second embodiment of the present invention, four leg portions 106 for spacing a side surface 110*a* and a side surface 120*d* on a side mounted with a housing 101 from a surface mounted with the housing 101 are provided on a side surface (outer surface) 110*a* formed with the first vent hole 110*b* of an upper housing 110 and a side surface (outer surface) 120*d* of a lower housing 120, as shown in FIGS. 13 and 14. Four leg portions 106 for spacing a side surface 120*a* and a side surface 110*d* on the side mounted with the housing 101 from the surface mounted with the housing 101 are provided on a side surface (outer surface) 120*a* formed with the second vent hole 120*b* of a lower housing 120 and a side surface (outer surface) 110*d* of the upper housing 110. The leg portions 106 may be made of rubber and mounted on the housing 101, and a plurality of the leg portions 106 may be integrally provided with the housing 101.

Figure 10:
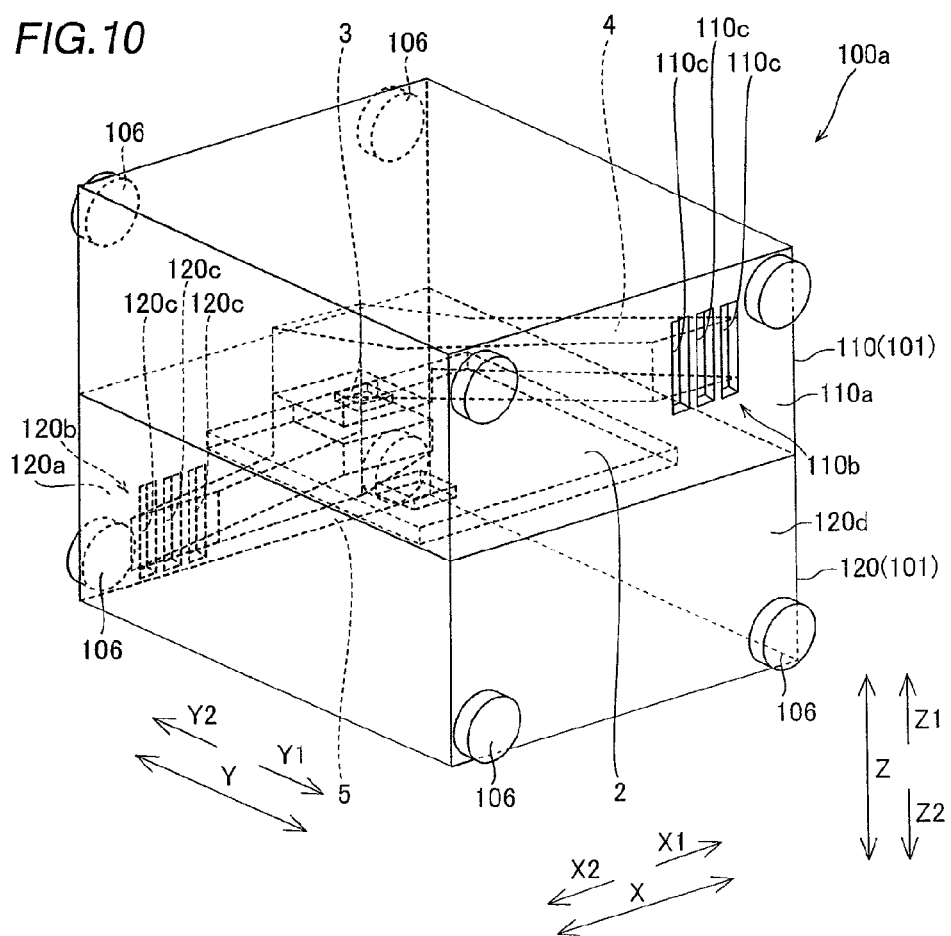
FIG. 10 is an entire perspective view of a heat radiation mechanism of an electronic apparatus according to a second embodiment of the present invention.
Figure 11:
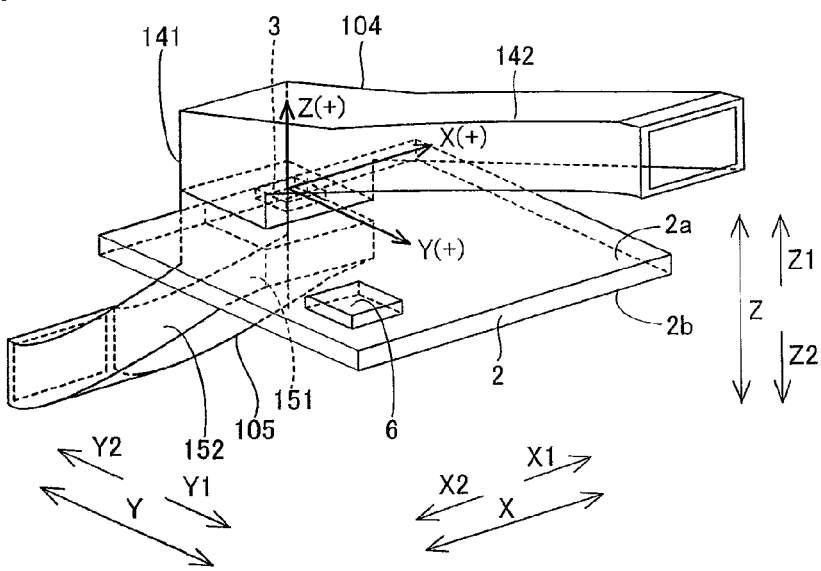
FIGS. 11 and 12 are perspective views of the heat radiation mechanism of the electronic apparatus according to the second embodiment of the present invention.
Figure 12:
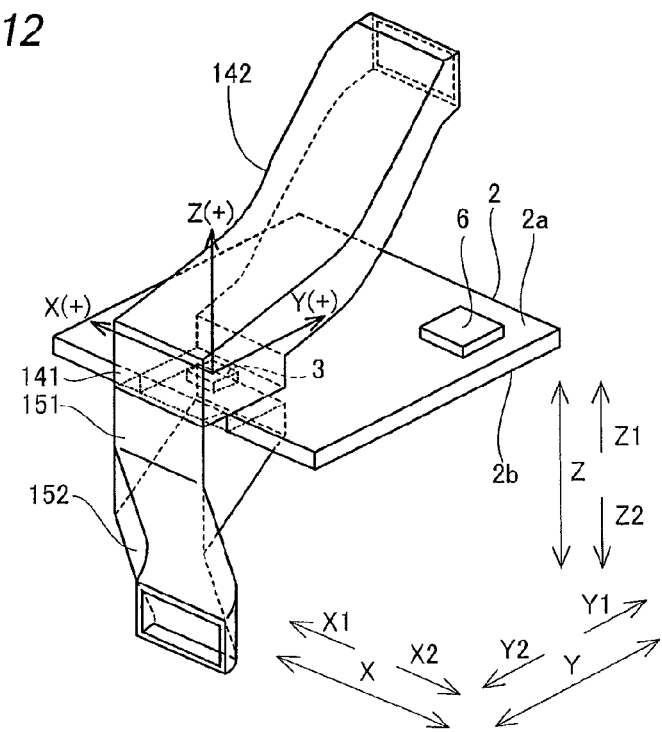

In the heat radiation mechanism of the electronic apparatus 100*a*, in the case where the X-axis, the Y-axis and the Z-axis orthogonal to each other are considered assuming that the center of the heating device 3 is the origin, the first vent hole 110*b* is provided on the plus direction sides (sides along arrows X1 (X(+)), Y1 (Y(+)) and Z1 (Z(+)) of the three X-, Y- and Z-axes (directions X, Y and Z) of the housing 101, while the second vent hole 120*b* is provided on the minus direction sides (sides along arrows X2 (X(−)), Y2 (Y(−)) and Z2 (Z(−)) of the X-, Y- and Z-axes (directions X, Y and Z) of the housing 101, as shown in FIGS. 10 to 12.

This first vent hole 110*b* includes rectangular three slits 110*c* extending in a direction Z, as shown in FIG. 10. The first vent hole 110*b* is formed above the heating device 3 (on a side along arrow Z1), as shown in FIG. 14. The three slits 110c are so chamfered that opening areas are increased from an inner surface side (side along arrow Y2) of the upper housing 110 toward an outer surface side (side along arrow Y1).

The second vent hole 120b includes rectangular three slits 120c extending in the direction Z, as shown in FIG. 10. The second vent hole 120b is formed below the heating device 3 (on a side along arrow Z2), as shown in FIG. 14. The three slits 120c are so chamfered that opening areas are increased from an inner surface side (side along arrow Y1) of the lower housing 120 toward an outer surface side (side along arrow Y2).

The heat radiation mechanism of the electronic apparatus 100a comprises a first duct 104 and a second duct 105, as shown in FIG. 11. The first duct 104 includes a first air flow portion 141 and a second air flow portion 142. The second duct 105 includes a first air flow portion 151 and a second air flow portion 152.

The second air flow portion 142 of the first duct 104 is formed to extend in the plus direction side (side along arrow X1 (X(+))) of the X-axis (direction X) and extend in the plus direction side (side along arrow Y1 (Y(+))) of the Y-axis (direction Y) by employing the center of the heating device 3 as the origin in plan view, as shown in FIG. 13. The second air flow portion 142 of the first duct 104 is formed to extend in the plus direction side (side along arrow Z1 (Z (+))) of the Z-axis (direction Z) by employing the center of the heating device 3 as the origin, as shown in FIG. 14.

The second air flow portion 152 of the second duct 105 is formed to extend in the minus direction side (side along arrow X2 (X(−))) of the X-axis (direction X) and extend in the minus direction side (side along arrow Y2 (Y(−))) of the Y-axis (direction Y) by employing the center of the heating device 3 as the origin in plan view, as shown in FIG. 13. The second air flow portion 152 of the second duct 105 is formed to extend in the minus direction side (side along arrow Z2 (Z(−))) of the Z-axis (direction Z) by employing the center of the heating device 3 as the origin, as shown in FIG. 14.

The remaining structure of the second embodiment is similar to that of the aforementioned first embodiment.

A plurality of set patterns of the electronic apparatus 100a according to the second embodiment of the present invention and the heat radiation route of the heat radiation mechanism in each set pattern will be now described with reference to FIGS. 14 to 17.

As shown in FIG. 14, in a case where a bottom surface (outer surface) 120e of the lower housing 120 of the housing 101 is set on a floor (set surface), cold air (outside air) is sucked from the second vent hole 120b formed on the lower housing 120 in the heat radiation mechanism of the electronic apparatus 100a. The sucked air passes through the second and first air flow portions 152 and 151 of the second duct 105 and moves to the first air flow portion 141 of the first duct 104 through the opening 8. Thus, the heating device 3 is cooled. Then, air warmed by heat of the heating device 3 has a reduced air density and becomes rising air. Thereafter, the air passes through the second air flow portion 142 of the first duct 104 and is discharged (radiated) from the first vent hole 110b formed on the upper housing 110.

Figure 15:
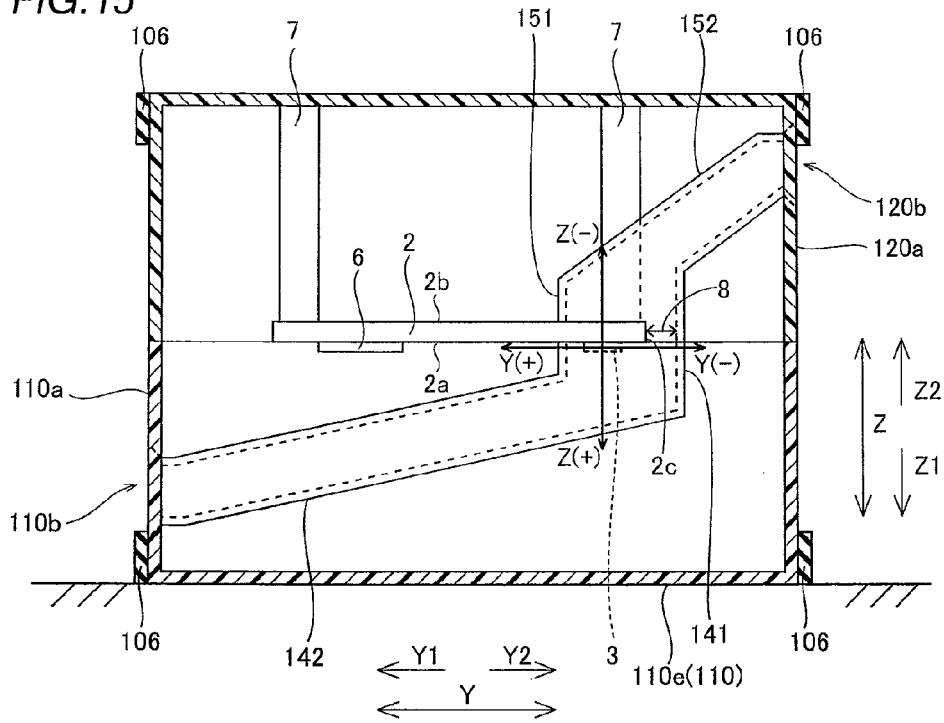

As shown in FIG. 15, in a case where an upper surface (outer surface) 111e of the upper housing 110 of the housing 101 is set on a floor (set surface), cold air (outside air) is sucked from the first vent hole 110b formed on the upper housing 110 in the heat radiation mechanism of the electronic apparatus 100a. The sucked air passes through the second and first air flow portions 142 and 141 of the first duct 104 and the heating device 3 is cooled. Then, air warmed by heat of the heating device 3 has a reduced air density and becomes rising air. Thereafter, the rising air passes through the first and second air flow portions 151 and 152 of the second duct 105 through the opening 8 and is discharged (radiated) from the second vent hole 120b formed on the lower housing 120.

Figure 16:
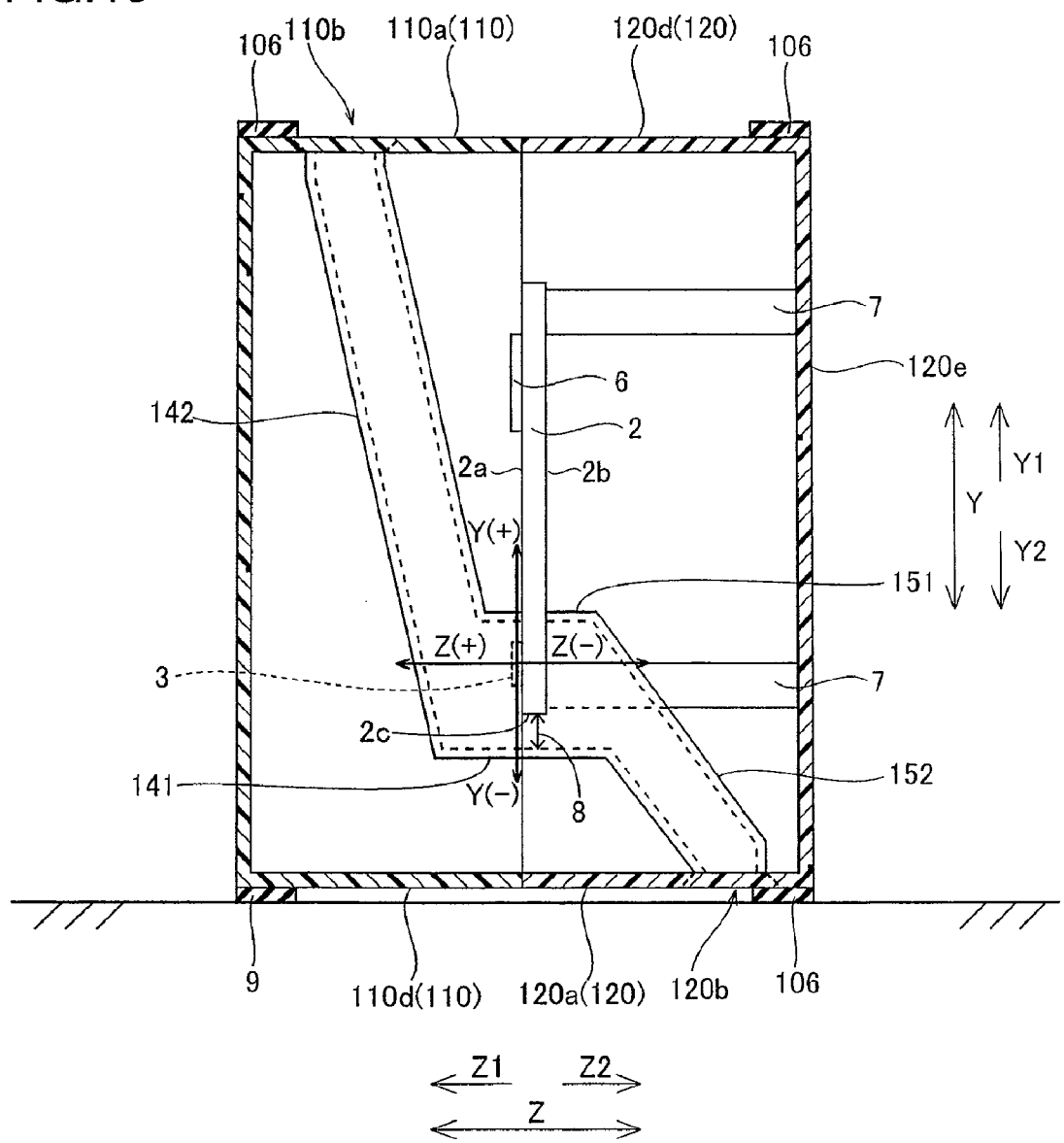

As shown in FIG. 16, in a case where the leg portions 106 provided on the side surfaces 110d and 120a of the upper and lower housings 110 and 120 of the housing 101 is set on a floor (set surface), cold air (outside air) is sucked from the second vent hole 120b formed on the lower housing 120 in the heat radiation mechanism of the electronic apparatus 100a. The sucked air passes through the second and first air flow portions 152 and 151 of the second duct 5 and is guided to the first air flow portion 141 of the first duct 104 through the opening 8. Thus, the heating device 3 is cooled. Then, air warmed by heat of the heating device 3 has a reduced air density and becomes rising air. Thereafter, the rising air passes through the second air flow portion 142 of the first duct 104 and is discharged (radiated) from the first vent hole 110b formed on the upper housing 110. In this case, the leg portions 106 are provided on the surface side provided with the second vent hole 120b, whereby the second vent hole 120b can be inhibited from being blocked by the floor.

Figure 17:
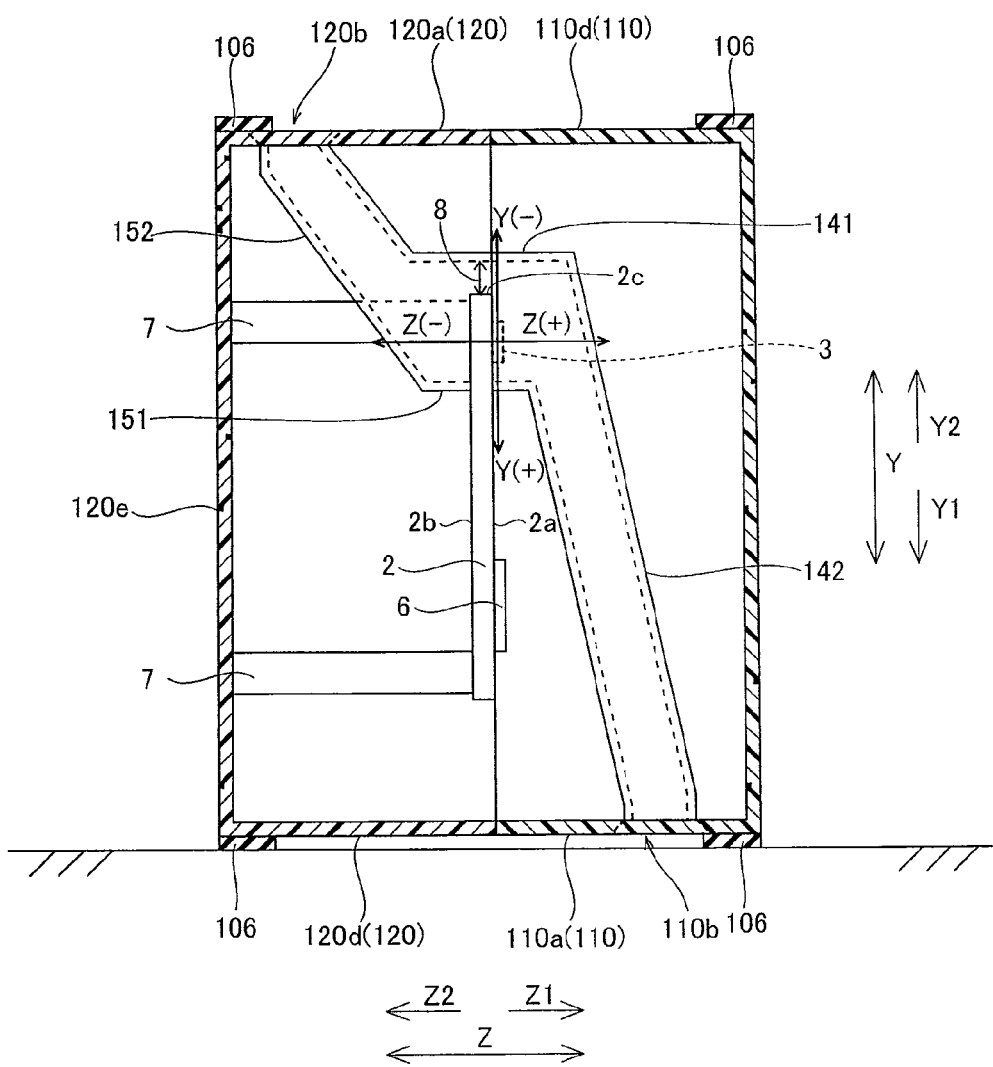

As shown in FIG. 17, in a case where the leg portions 106 provided on the side surfaces (outer surface) 110a and 120d of the upper and lower housings 110 and 120 of the housing 101 is set on a floor (set surface), cold air (outside air) is sucked from the first vent hole 110b formed on the upper housing 110 in the heat radiation mechanism of the electronic apparatus 100a. The sucked air passes through the second and first air flow portions 142 and 141 of the first duct 104 and the heating device 3 is cooled. Then, air warmed by heat of the heating device 3 has a reduced air density and becomes rising air. Thereafter, the rising air passes through the first and second air flow portions 151 and 152 of the second duct 105 through the opening 8 and is discharged (radiated) from the second vent hole 120b formed on the lower housing 120. In this case, the leg portions 106 are provided on the surface side formed with the first vent hole 110b, whereby the first vent hole 110b can be inhibited from being blocked by the floor.

According to the second embodiment, as hereinabove described, in the case where the X-axis, the Y-axis and the Z-axis orthogonal to each other are considered assuming that the heating device 3 is the origin, the first vent hole 110b is provided on the plus direction sides (sides along arrows X1 (X(+)), Y1 (Y(+)) and Z1 (Z(+)) of the X-, Y- and Z-axes (directions X, Y and Z), while the second vent hole 120b is provided on the minus direction sides (sides along arrows X2 (X(−)), Y2 (Y(−)) and Z2 (Z(−)) of the X-, Y- and Z-axes (directions X, Y and Z), whereby the first and second vent holes 110b and 120b are formed to be diagonal (on opposite sides) with each other in the three X-, Y- and Z-axial directions by employing the heating device 3 as the origin, and hence one of either the first vent hole 110b or the second vent hole 120b can be always located above the heating device 3, while the other of either the first vent hole 110b or the second vent hole 120b can be always located below the heating device 3 also in a case where the outer surface on which the housing 101 is set (mounted) is changed, for example. Thus, the first vent hole 110b and the second vent hole 120b are not located at the same height, and hence air sucked from the vent hole located below the heating device 3 can be always discharged from the vent hole located above the heating device 3.

According to the second embodiment, as hereinabove described, the leg portions 106 for spacing the side surface 110a (120a) on the set surface side of the housing 101 from the set surface of the housing 101 are provided on the side surface 110a (120a) on the set surface side of the housing 101 among the side surface 110a (120a) formed with the first and second vent holes 110b and 120b of the housing 101, whereby the first or second vent hole 110b or 120b of the housing 101 can be inhibited from being blocked by the set surface of the housing 101, and hence suction of the air from the first or second vent hole 110b or 120b and discharge of the air from the first or second vent hole 110b or 120b can be reliably performed.

(Third Embodiment)

Figure 18:
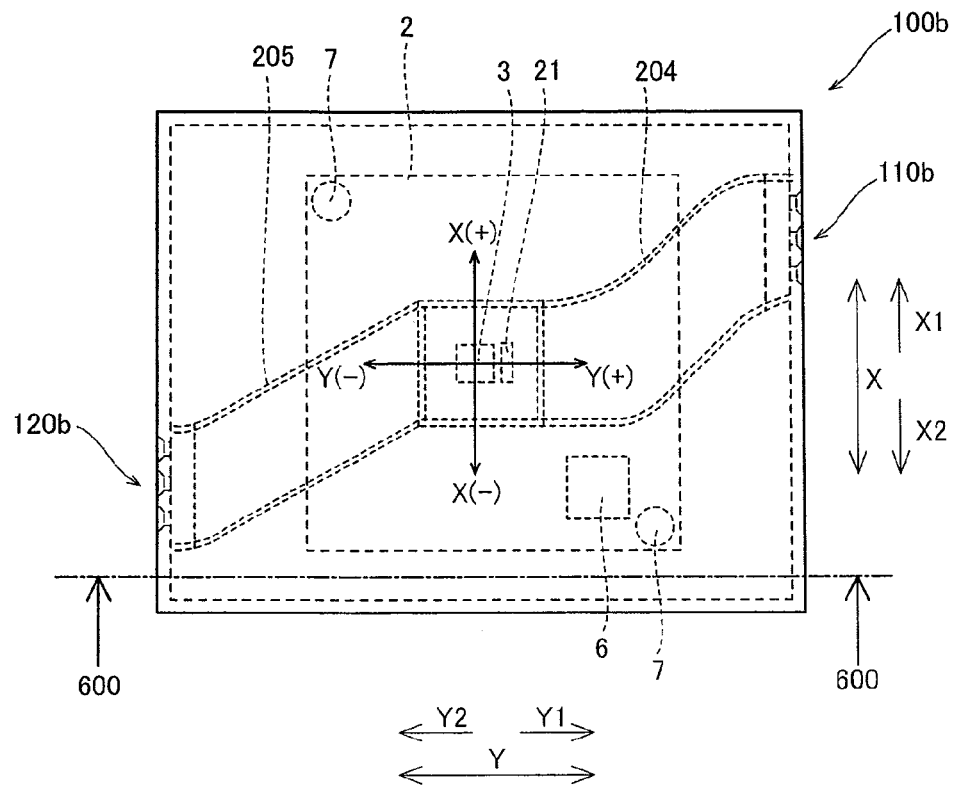
FIG. 18 is a plan view of the heat radiation mechanism of the electronic apparatus according to the third embodiment of the present invention.
Figure 19:
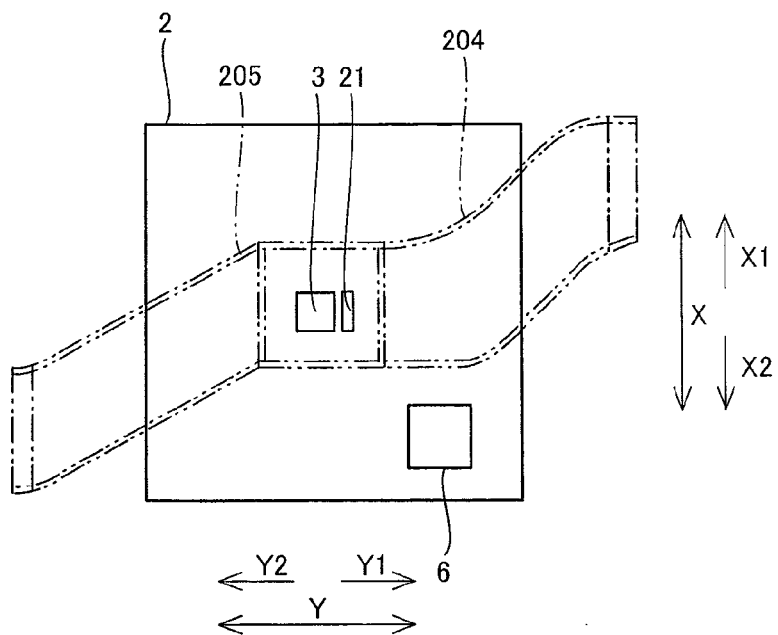
FIG. 19 is a plan view showing a circuit board of the heat radiation mechanism of the electronic apparatus according to the third embodiment of the present invention.
Figure 20:
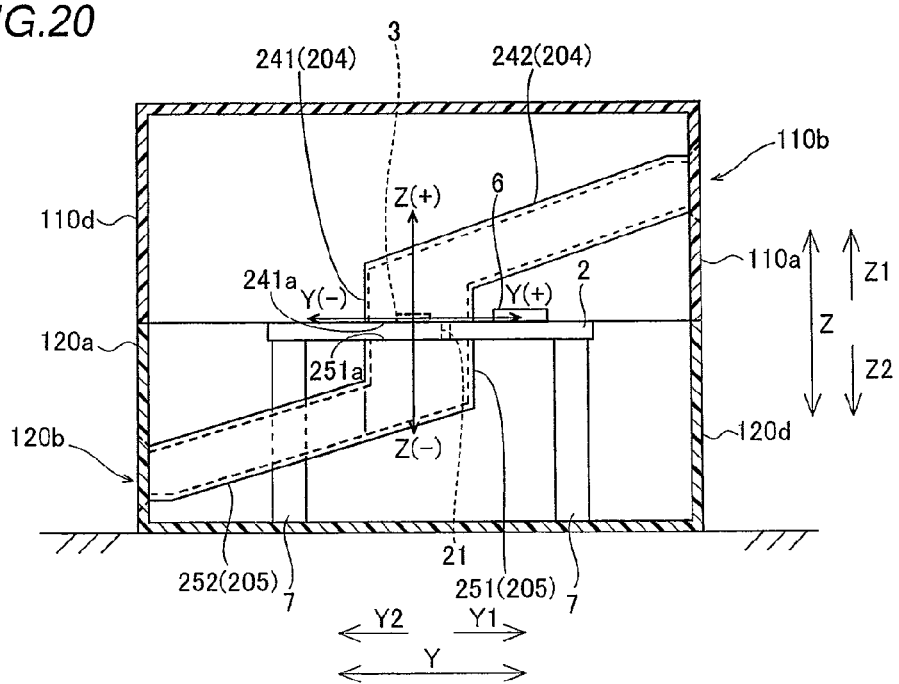
FIG. 20 is a sectional view taken along the line 600-600 in FIG. 18.

Referring to FIGS. 18 to 20, in a structure of a heat radiation mechanism of an electronic apparatus 100b according to a third embodiment of the present invention, an air flow hole 21 allowing flow of air is provided in the vicinity of a region mounted with a heating device 3 of a circuit board 2 dissimilarly to the aforementioned second embodiment.

In the heat radiation mechanism of the electronic apparatus 100b, the heating device 3 is mounted in the vicinity of a center of the circuit board 2, as shown in FIGS. 18 and 19. The one air flow hole 21 is provided on the region mounted with the heating device 3 of the circuit board 2 arranged in an air flow route constituted by a first duct 204 and a second duct 205, so that an opening allowing flow of air between the first duct 204 side and the second duct 205 side is formed. This one air flow hole 21 is formed in a substantially rectangular shape in plan view.

As shown in FIG. 20, the circuit board 2 is set on a boundary between the first duct 204 and the second duct 205. A lower surface 241a of a first air flow portion 241 of the first duct 204 is arranged to be in close contact with an upper surface 2a of the circuit board 2. An upper surface 251a of a first air flow portion 251 of the second duct 205 is arranged to be in close contact with a lower surface 2b of the circuit board 2. Thus, the circuit board 2 is held between the lower surface 241a of the first air flow portion 241 of the first duct 204 and the upper surface 251a of the first air flow portion 251 of the second duct 205.

The remaining structure of the third embodiment is similar to that of the aforementioned second embodiment.

A heat radiation route of the heat radiation mechanism of the electronic apparatus 100b according to the third embodiment of the present invention will be described with reference to FIG. 20.

As shown in FIG. 20, in the heat radiation mechanism of the electronic apparatus 100b according to the third embodiment of the present invention, cold air (outside air) is sucked from the a second vent hole 120b formed on a lower housing 120. The sucked air passes through a second air flow portion 252 and the first air flow portion 251 of the second duct 205 and passes through the first air flow portion 241 of the first duct 204 through the air flow hole 21 formed on the circuit board 2, and the heating device 3 is cooled. Then, air warmed by heat of the heating device 3 has a reduced air density and becomes rising air. Thereafter, the rising air passes through a second air flow portion 242 of the first duct 204 and is discharged (radiated) from the first vent hole 110b formed on an upper housing 110.

According to the third embodiment, as hereinabove described, the air flow hole 21 is provided in the vicinity of the region mounted with the heating device 3 of the circuit board 2 arranged in the air flow route, so that the opening allowing flow of air between the first duct 204 side and the second duct 205 side is formed, whereby the cold air sucked from the second duct 205 side can be guided to the first duct 204 side through the opening consisting of the air flow hole 21 provided in the vicinity of the region mounted with the heating device 3 of the circuit board 2.

According to the third embodiment, as hereinabove described, the first duct 204 and the second duct 205 are arranged to be in close contact with the upper surface 2a of the circuit board 2, whereby air can flow between the first duct 204 and the second duct 205 through the opening consisting of the air flow hole 21 while suppressing leak of the air from between the first duct 204 and the circuit board 2 and from between the second duct 205 and the circuit board 2.

The remaining effects of the third embodiment are similar to those of the aforementioned second embodiment.

Although the present invention has been described and illustrated in detail, it is clearly understood that the same is by way of illustration and example only and is not to be taken by way of limitation, the spirit and scope of the present invention being limited only by the terms of the appended claims.

Figure 21:
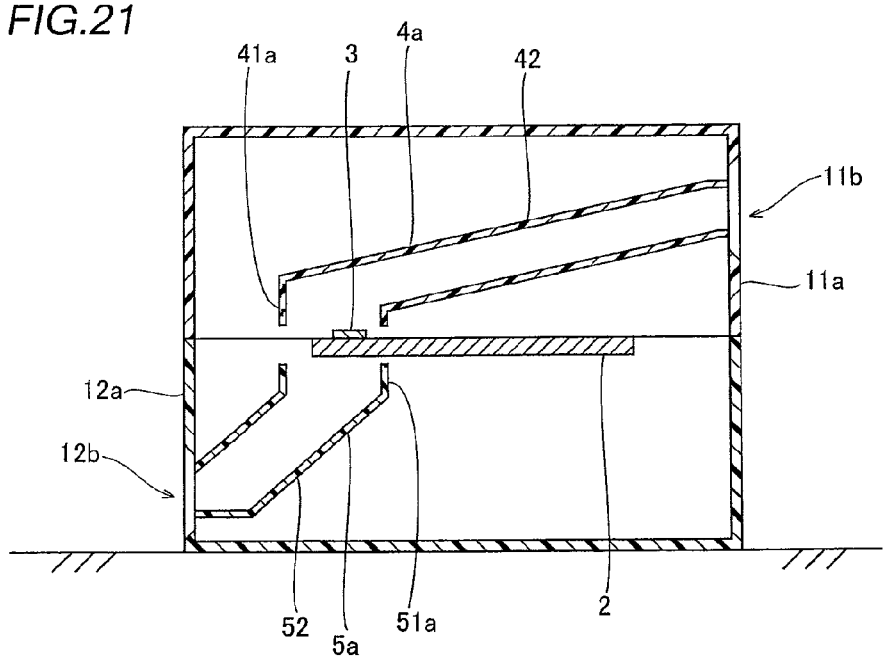
FIG. 21 is a sectional view showing a modification of the radiation mechanism of the electronic apparatus according to each of the first to third embodiments of the present invention.

For example, while the air flow route is formed by connecting the first duct and the second duct with no clearance in each of the aforementioned first to third embodiments, the present invention is not restricted to this, but clearances may be provided between a lower surface of a first air flow portion 41a of a first duct 4a on a heating device side and a circuit board 2 and between an upper surface of a first air flow portion 51a of a second duct 5a on the heating device side and the circuit board 2 as in a modification shown in FIG. 21.

While the two first and second ducts are provided with respect to the one heating device in each of the aforementioned first to third embodiments, the present invention is not restricted to this, but a plurality of ducts may be provided in response to the number of heating devices, or the two first and second ducts covering a plurality of heating devices may be provided with respect to the plurality of ducts.

While the sections of the air flow routes of the first and second ducts are rectangular (horizontally-long rectangular) in each of the aforementioned first to third embodiments, the present invention is not restricted to this, but the sections may be formed in shapes such as circular shapes as other than the rectangular shapes.

While the air flow hole constituting the opening is rectangular in plan view in the aforementioned third embodiment, the present invention is not restricted to this, but the air flow hole constituting the opening may be formed in shapes such as circular shapes other than the rectangular shapes in plan view, for example.

What is claimed is:

1. A heat radiation mechanism of an electronic apparatus comprising:
  a housing set with a circuit board mounted with a heating device therein and including a first vent hole formed on a prescribed outer surface to be located above said heating device and a second vent hole formed on an outer surface different from the outer surface formed with said first vent hole to be located below said heating device;
  a first duct arranged to extend from said first vent hole toward said circuit board; and
  a second duct arranged to extend from said second vent hole toward said circuit board, wherein
  an air flow route allowing flow of air between said first vent hole and said second vent hole is formed by said first duct and said second duct, at least a portion of the circuit board mounted with said heating device is arranged in said air flow route, and an opening allowing flow of air between said first duct side and said second duct side is formed on the portion mounted with said heating device of said circuit board in said air flow route,
  heat generated from said heating device is radiated from said first vent hole or said second vent hole through said air flow route, and said first duct and said second duct include first air flow portions arranged on said heating device sides and formed to extend in a direction substantially perpendicular to said circuit board, and second air flow portions arranged on said first vent hole side and said second vent hole side respectively and formed to be inclined by prescribed angles with respect to said first air flow portions, respectively.

2. The heat radiation mechanism of an electronic apparatus according to claim 1, wherein
a portion of said first duct on said circuit board side and a portion of said second duct on said circuit board side are connected substantially with no clearance in a state of holding the portion mounted with said heating device of said circuit board therebetween.

3. The heat radiation mechanism of an electronic apparatus according to claim 1, wherein
a portion of said first duct on said circuit board side and a portion of said second duct on said circuit board side are arranged to be in close contact with each other in a state of holding the portion mounted with said heating device of said circuit board therebetween.

4. The heat radiation mechanism of an electronic apparatus according to claim 1, wherein
in a case where an X-axis, a Y-axis and a Z-axis orthogonal to each other are considered assuming that said heating device is an origin,
said first vent hole is provided on plus direction sides of at least the Y- and Z-axes, and said second vent hole is provided on minus direction sides of at least the Y- and Z-axes.

5. The heat radiation mechanism of an electronic apparatus according to claim 4, wherein
said first vent hole is provided on the plus direction sides of the X-, Y- and Z-axes, and said second vent hole is provided on the minus direction sides of the X-, Y- and X-axes.

6. The heat radiation mechanism of an electronic apparatus according to claim 1, wherein
a portion of said first duct on said first vent hole side and said first vent hole are connected substantially with no clearance, and a portion of said second duct on said second vent hole side and said second vent hole are connected substantially with no clearance.

7. The heat radiation mechanism of an electronic apparatus according to claim 1, wherein
at least one of said first duct and said second duct includes a first air flow portion arranged on said heating device side, and a second air flow portion arranged on at least one of said first vent hole side and said second vent hole side, and
a section area of the air flow route of said second air flow portion is smaller than a section area of the air flow route of said first air flow portion.

8. The heat radiation mechanism of an electronic apparatus according to claim 1, wherein
said opening allowing flow of air between said first duct side and said second duct side is substantially rectangular in plan view,
said opening and said heating device are arranged to be adjacent to each other, and
a length of said opening in a longitudinal direction is larger than a length of said heating device corresponding to the longitudinal direction of said opening.

9. The heat radiation mechanism of an electronic apparatus according to claim 1, wherein
at least one leg portion is provided on the outer surface of said housing having one of the first and second vent holes, the leg portion spacing the outer surface of said housing, which forms a set surface side, from a set surface for said housing.

10. The heat radiation mechanism of an electronic apparatus according to claim 1, wherein
a prescribed clearance is formed between a side end of said circuit board arranged on a boundary between said first duct and said second duct in said air flow route and an inner surface of said air flow route opposed to the side end of said circuit board, so that said opening allowing flow of air between said first duct side and said second duct side is formed.

11. The heat radiation mechanism of an electronic apparatus according to claim 10, wherein
said circuit board is arranged on a partial region of the boundary between said first duct and said second duct to be held between said first duct and said second duct, and
portions, holding said circuit board therebetween, of said first duct and said second duct are in close contact with surfaces of said circuit board, and portions, other than the portions holding said circuit board therebetween, of said first duct and said second duct are arranged to be in close contact with each other.

12. The heat radiation mechanism of an electronic apparatus according to claim 1, wherein
an air flow hole is provided in the vicinity of a region mounted with said heating device of said circuit board arranged in said air flow route, so that said opening allowing flow of air between said first duct side and said second duct side is formed.

13. The heat radiation mechanism of an electronic apparatus according to claim 12, wherein
said circuit board provided with said air flow hole is arranged to be held between said first duct and said second duct in a state of blocking said first duct and said second duct on the boundary between said first duct and said second duct, and
said first duct and said second duct are arranged to be in close contact with the surfaces of said circuit board.

14. The heat radiation mechanism of an electronic apparatus according to claim 1, wherein
each of said first vent hole and said second vent hole arranged with said first duct and said second duct respectively is so chamfered that an opening area is increased from an inner surface side of said housing toward an outer surface side.

15. An electronic apparatus comprising:
a circuit board mounted with a heating device;
a housing set with said circuit board therein and including a first vent hole formed on a prescribed outer surface to be located above said heating device and a second vent hole formed on an outer surface different from the outer surface formed with said first vent hole to be located below said heating device;
a first duct arranged to extend from said first vent hole toward said circuit board; and
a second duct arranged to extend from said second vent hole toward said circuit board, wherein
an air flow route allowing flow of air between said first vent hole and said second vent hole is formed by said first duct and said second duct, at least a portion of the circuit board mounted with said heating device is arranged in said air flow route, and an opening allowing flow of air between said first duct side and said second duct side is formed on the portion mounted with said heating device of said circuit board in said air flow route, heat generated from said heating device is radiated from said first vent hole or said second vent hole through said air flow route, and said first duct and said second duct include first air flow portions arranged on said heating device sides and formed to extend in a direction substantially perpendicular to said circuit board, and second air flow portions arranged on said first vent hole side and said second vent hole side respectively and formed to be inclined by prescribed angles with respect to said first air flow portions, respectively.

16. The electronic apparatus according to claim 15, wherein a portion of said first duct on said circuit board side and a portion of said second duct on said circuit board side are connected substantially with no clearance in a state of holding the portion mounted with said heating device of said circuit board therebetween.

17. The electronic apparatus according to claim 15, wherein a portion of said first duct on said circuit board side and a portion of said second duct on said circuit board side are arranged to be in close contact with each other in a state of holding the portion mounted with said heating device of said circuit board therebetween.

18. The electronic apparatus according to claim 15, wherein in a case where an X-axis, a Y-axis and a Z-axis orthogonal to each other are considered assuming that said heating device is an origin, said first vent hole is provided on plus direction sides of at least the Y- and Z-axes, and said second vent hole is provided on minus direction sides of at least the Y- and Z-axes.

19. The electronic apparatus according to claim 18, wherein said first vent hole is provided on the plus direction sides of the X-, Y- and Z-axes, and said second vent hole is provided on the minus direction sides of the X-, Y- and Z-axes.

* * * * *